United States Patent
Aton et al.

(10) Patent No.: US 7,906,253 B2
(45) Date of Patent: Mar. 15, 2011

(54) SYSTEM AND METHOD FOR MAKING PHOTOMASKS

(75) Inventors: Thomas J. Aton, Dallas, TX (US); Carl A. Vickery, Garland, TX (US)

(73) Assignee: Texas Instruments Incorporated, Dallas, TX (US)

(*) Notice: Subject to any disclaimer, the term of this patent is extended or adjusted under 35 U.S.C. 154(b) by 591 days.

(21) Appl. No.: 11/863,753

(22) Filed: Sep. 28, 2007

(65) Prior Publication Data

US 2009/0087619 A1 Apr. 2, 2009

(51) Int. Cl.
*G03F 1/00* (2006.01)
*G03C 5/00* (2006.01)

(52) U.S. Cl. ............................... 430/5; 430/311
(58) Field of Classification Search ....... 430/5; 438/689
See application file for complete search history.

(56) References Cited

U.S. PATENT DOCUMENTS

| | | | |
|---|---|---|---|
| 7,132,203 B2* | 11/2006 | Pierrat | 430/5 |
| 2002/0187636 A1* | 12/2002 | Pierrat et al. | 438/689 |
| 2002/0192575 A1* | 12/2002 | Stanton | 430/5 |
| 2003/0124847 A1* | 7/2003 | Houston et al. | 438/689 |
| 2006/0046160 A1* | 3/2006 | Wallace et al. | 430/5 |

OTHER PUBLICATIONS

Aton, U.S. Appl. No. 11/771,515, filed Jun. 29, 2007.
Aton, U.S. Appl. No. 11/863,717, filed Sep. 28, 2007.
Aton, U.S. Appl. No. 11/940,990, filed Nov. 15, 2007.
Aton et al., U.S. Appl. No. 11/940,016, filed Nov. 14, 2007.
Aton et al., U.S. Appl. No. 11/940,245, filed Nov. 14, 2007.
Aton et al., U.S. Appl. No. 11/940,194, filed Nov. 14, 2007.
Aton et al., U.S. Appl. No. 11/940,270, filed Nov. 14, 2007.

* cited by examiner

*Primary Examiner* — Stephen Rosasco
*Assistant Examiner* — Rashid Alam
(74) *Attorney, Agent, or Firm* — Warren L. Franz; Wade J. Brady, III; Frederick J. Telecky, Jr.

(57) ABSTRACT

The present disclosure is directed to a method for preparing photomask patterns for a lithography process that employs a plurality of photomasks. The method comprises receiving data describing a drawn pattern. An edge of the drawn pattern is identified that can be defined using a first photomask and a second photomask, and the first photomask is chosen for patterning the edge. Patterns are formed for the first photomask and the second photomask, wherein the first photomask pattern is formed to pattern the edge, and the second photomask pattern is formed to have a wing adjacent to the edge for protecting the edge from double patterning. A process for patterning an integrated circuit device is also disclosed.

12 Claims, 4 Drawing Sheets

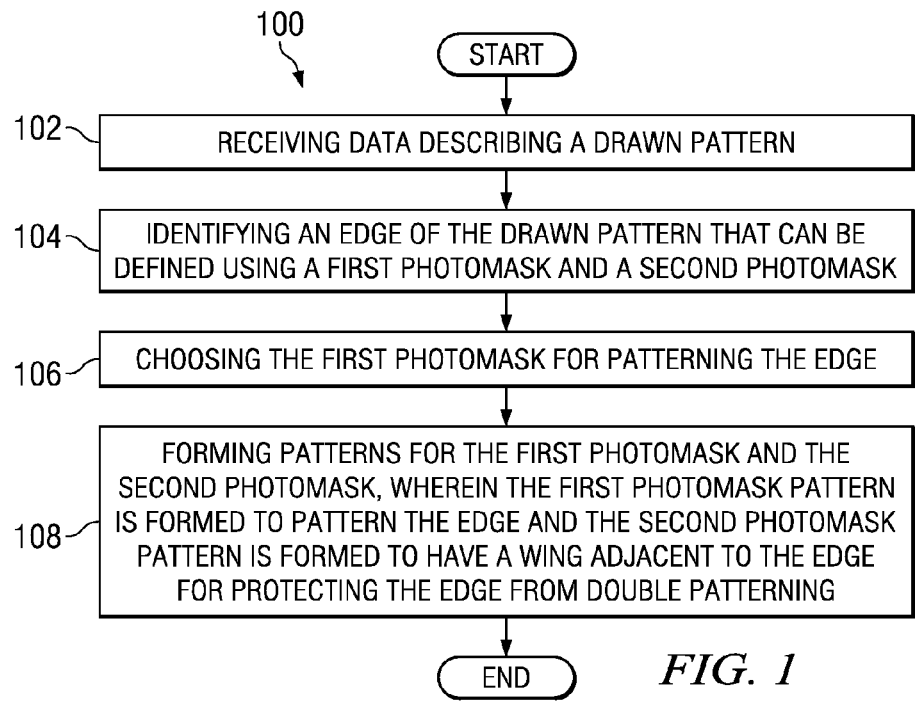
FIG. 1
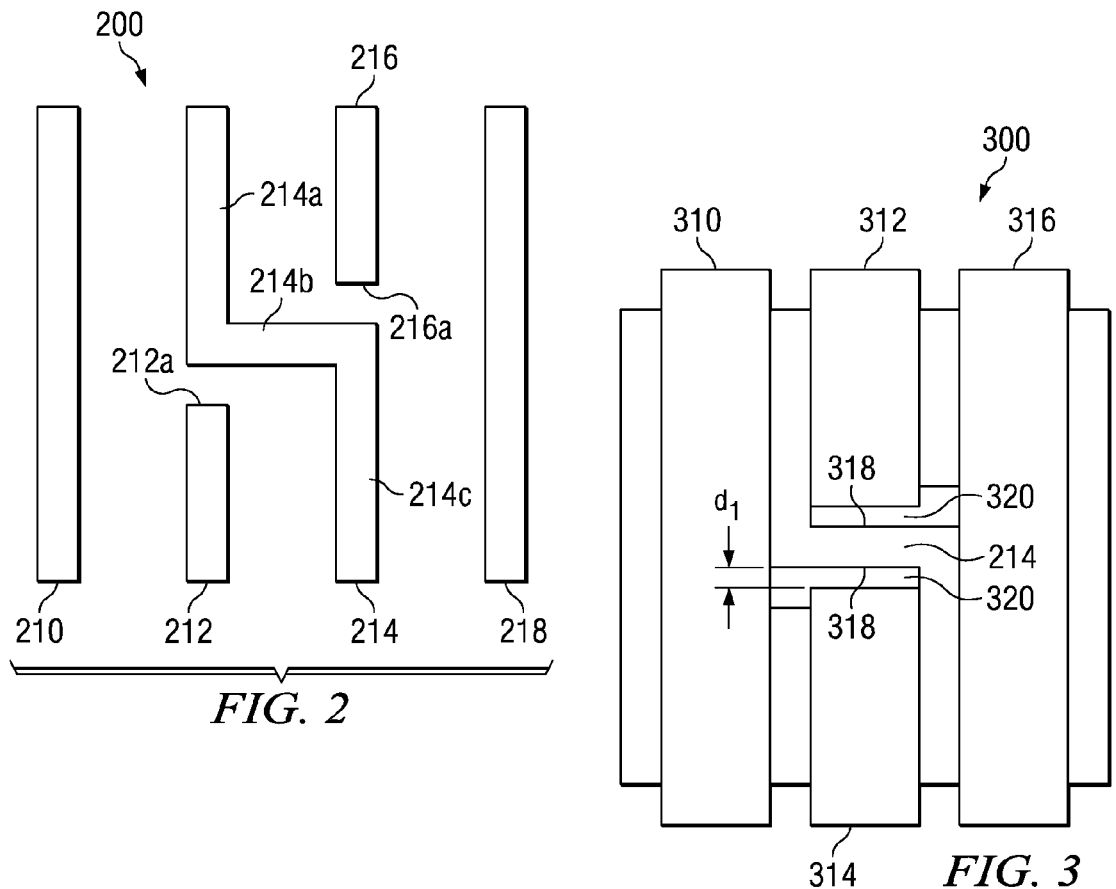
FIG. 2
FIG. 3

SYSTEM AND METHOD FOR MAKING PHOTOMASKS

FIELD OF THE DISCLOSURE

The present application relates generally to the field of photolithography, and more specifically to a method and system for preparing a pattern for a photomask.

BACKGROUND OF THE DISCLOSURE

Conventional optical projection lithography has been the standard silicon patterning technology for the past 20 years. It is an economical process due to its inherently high throughput, thereby providing a desirable low cost per part or die produced. A considerable infrastructure (including steppers, photomasks, resists, metrology, etc.) has been built up around this technology.

In this process, a photomask, or "reticle", includes a semiconductor circuit layout pattern typically formed of opaque chrome, on a transparent glass (typically $SiO_2$) substrate. A stepper includes a light source and optics that project light coming through the photomask to image the circuit pattern, typically with a 4× to 5× reduction factor, on a photo-resist film formed on a wafer. The term "chrome" refers to an opaque masking material that is typically but not always comprised of chrome. The transmission of the opaque material on the photomask may also vary, such as in the case of an attenuating phase shift mask.

The process of making the photomask begins by receiving data from a design database. The design database contains data describing at least a portion of an integrated circuit design layout, referred to as the "drawn" pattern, which generally provides a target pattern that the designers wish to achieve on the wafer. Techniques for forming design databases are well known in the art.

After receiving the design database, mask makers form one or more photomasks that can be used to implement the target pattern described by the design data. This mask making process may generally include generating mask pattern data describing initial photomask patterns for forming device features. The initial photomask patterns are formed by employing various resolution enhancement techniques. The resolution enhancement techniques can include splitting the drawn pattern so that it is patterned using two or more photomasks, such as, for example, a phase shift mask and a trim mask, for use in an alternating phase shift process ("altPSM"). Alternative phase shift processes may also be referred to as strong phase shift or Levinson phase shift technologies. Such resolution enhancement techniques for forming initial photomask patterns from design data are well known in the art.

After the initial photomask patterns are formed, a proximity correction process is carried out that corrects the mask pattern data for proximity effects. The proximity correction process generally involves running proximity correction software to perform calculations that alter the shape of the initial photomask pattern to take into account proximity effects, such as optical diffraction effects that occur during the imaging process in this method, a computer simulation program is often used to compute image-like model values that are taken to represent the features formed for a particular photomask feature pattern or group of patterns. Based on these simulated model values, the photomask pattern can be altered and then simulated again to determine if the altered pattern will improved the printed features. This process can be repeated until the result is with desired specifications. The features added to a photomask pattern based on this procedure are called optical proximity correction features.

After proximity correction has been performed, verification of the mask pattern data can be performed. This can include running various quality checks to determine whether the photomask patterns generated will form the desired pattern for implementing the circuit specified in the drawn data. The mask pattern data can then be sent to a mask shop, where the actual photomasks are fabricated from the mask pattern data.

One of the most common commercial implementations of alternating phase shift mask technology is the double exposure method. In this method, the critical device features to be patterned are imaged using a phase shift mask, and the non-critical and trim features are imaged in a second exposure using a conventional chrome-on-glass mask, such as a trim mask. In the past, both the phase exposure and trim exposure were performed using a single photoresist.

More recently, a new process has been developed, referred to herein as two-print/two-etch ("2p/2e") or "double patterning," in which a first mask exposure and a second mask exposure, such as a phase exposure and trim exposure, are each performed on separate photoresists. The patterns from each of the photoresists can be individually transferred to, for example, a hardmask. In some processes, rather than employing a hardmask, the first and second mask patterns can be transferred directly to the wafer using the first and second photoresist patterns in two separate etch steps.

In 2p/2e processes, a first pattern may be formed in a first photoresist. The first pattern can then be transferred to a hardmask using an etching technique and the first photoresist removed. A second pattern can then be formed in a second photoresist and the resulting photoresist pattern is then transferred to the hardmask using a second etching step. Subsequently, the hardmask pattern, having both the first and second patterns etched therein, is used to etch the wafer.

The 2p/2e process allows for improvements in critical dimension control over single resist processing. However, the ever increasing densities of integrated circuit devices can make achieving the desired critical dimensions extremely difficult. Further refinements of the 2p/2e processing techniques are desired in order to achieve improved critical dimension control.

SUMMARY OF THE DISCLOSURE

In accordance with the disclosure, an embodiment of the present teachings is directed a method for preparing photomask patterns for a lithography process that employs a plurality of photomasks. The method comprises receiving data describing a drawn pattern. An edge of the drawn pattern is identified that can be defined using a first photomask and a second photomask, and the first photomask is chosen for patterning the edge. Patterns are formed for the first photomask and the second photomask, wherein the first photomask pattern is formed to pattern the edge, and the second photomask pattern is formed to have a wing adjacent to the edge for protecting the edge from double patterning.

Another embodiment of the present disclosure is directed to a multi-pattern process for patterning an integrated circuit device. The process comprises providing a substrate; forming a layer on the substrate; and applying a first photoresist over the layer. The first photoresist is exposed to radiation through a first photomask and the first photoresist is developed to form a first pattern. An etching process is carried out to transfer the first pattern into the layer, and the first photoresist is removed. A second photoresist is applied over the layer. The second photoresist is exposed to radiation through a second photomask and the second photoresist is developed to form a second pattern. An etching process is carried out to transfer the second pattern into the layer, and the second photoresist is removed. The first and second photomasks comprise one or more wings designed to prevent double patterning of an edge of the layer.

Additional objects and embodiments of the disclosure will be set forth in part in the description which follows, and can be learned by practice of the disclosure. It is to be understood that both the foregoing general description and the following detailed description are exemplary and explanatory only and are not restrictive of the disclosure, as claimed.

BRIEF DESCRIPTION OF THE DRAWINGS

The accompanying drawings, which are incorporated in and constitute a part of this specification, illustrate several embodiments of the disclosure and, together with the description, serve to explain the principles of the disclosure.

FIG. 1 illustrates a flow diagram of a multi-pattern process for making photomask patterns, according to an embodiment of the present disclosure.

FIG. 2 illustrates a drawn pattern for a broken-H gate, according to an embodiment of the present application.

FIG. 3 illustrates an embodiment of a first photomask pattern for forming the drawn pattern of FIG. 2, according to an embodiment of the present application.

DESCRIPTION OF THE EMBODIMENTS

Reference will now be made in detail to various exemplary embodiments of the present application, examples of which are illustrated in the accompanying drawings. Wherever possible, the same or similar reference numbers will be used throughout the drawings to refer to the same or like parts.

FIG. 1 illustrates a flow diagram 100 of a process for preparing photomask patterns, according to an embodiment of the present disclosure. It should be readily apparent to those of ordinary skill in the art that the flow diagram 100 depicted in FIG. 1 represents a generalized schematic illustration and that other steps may be added or existing steps may be removed or modified.

As illustrated at 102 of flow diagram 100, the process includes receiving data describing a drawn pattern layout. The drawn pattern layout can potentially be for any device that is patternable using lithographic methods, such as MEMS devices, integrated circuits, electron emitters, and other such devices.

Figure 7:
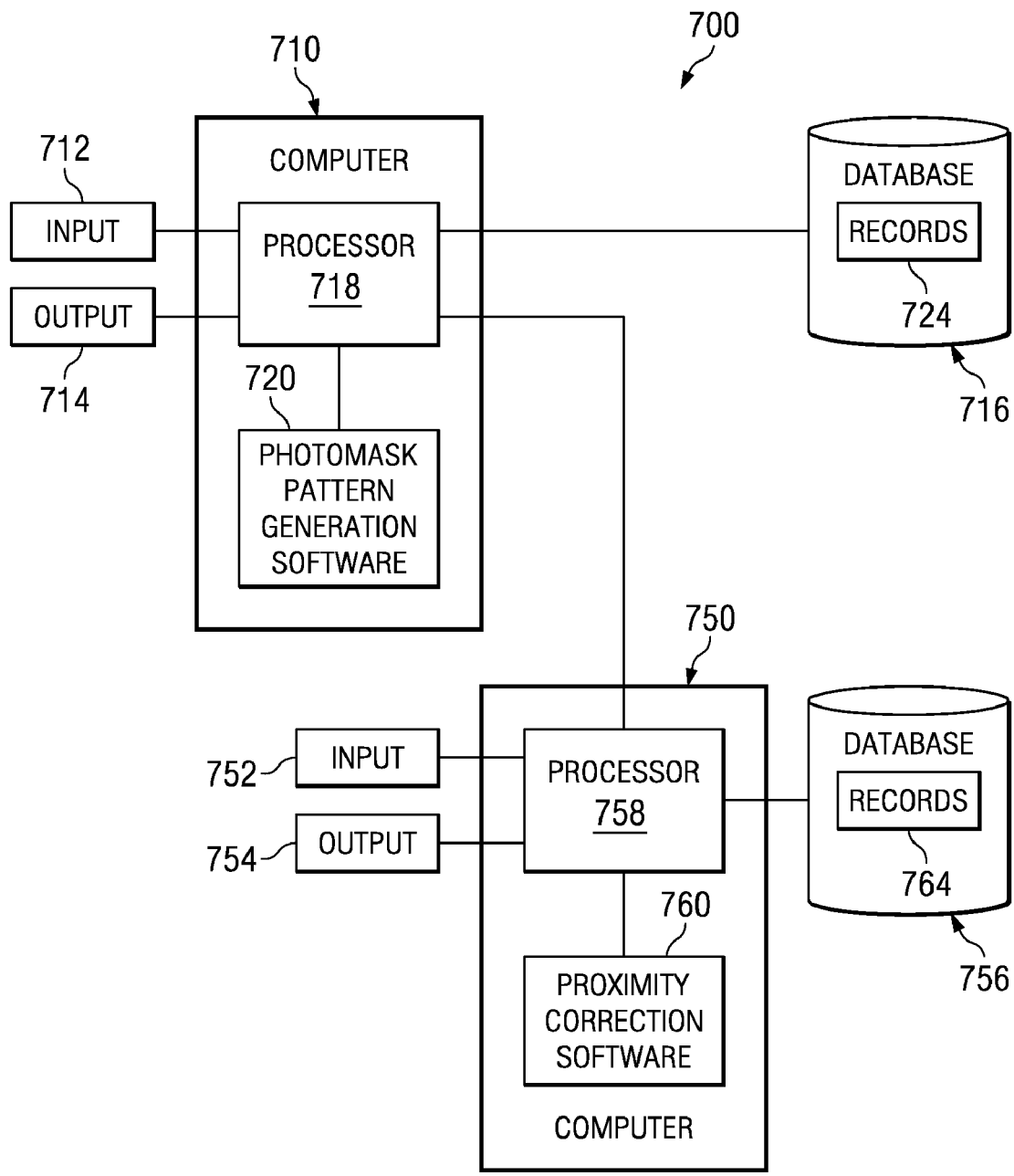
FIG. 7 illustrates a system 700 for forming a photomask pattern, according to an embodiment of the present disclosure.

The data can be received by a computer system used to form the photomask patterns, such as the one illustrated in FIG. 7 below. The computer system can include computer readable software for generating the desired photomask patterns based on the drawn data that is received. As illustrated in FIG. 7 and described in greater detail below, the software can include photomask pattern generation software 720 and proximity correction software 760. The process of flow chart 100 can be carried out by the generation software 720 and/or proximity correction software 760.

After receiving the drawn pattern data, 104 of flow chart 100 further includes identifying an edge of the drawn pattern that can be defined using a first photomask and a second photomask. Photomask patterns generally include a plurality of polygon shaped patterns having multiple edges. The edges of these polygon patterns define boundaries that will be used to pattern a desired device feature to be fabricated. For processes that employ more than one photomask, some edges to be patterned may potentially be defined by two or more photomasks. It has been found that such "double patterning" can be very undesirable, due at least in part to the potential for misalignment of the wafer patterns formed by the multiple photomasks.

Processes that employ multiple photomasks in multiple etch processing are referred to herein as "multi-pattern processing". One example of such multi-pattern processing is the 2p/2e process discussed above, where a device pattern is implemented using two photomasks that are employed to image two separate photoresists. However, processes that employ three or more photoresist patterning processes and/or three or more etch processes are also contemplated.

In multi-pattern processing, the mask scheme partitions the device pattern to be formed on the wafer into at least two patterns that will be formed on at least two separate photomasks. Thus, during fabrication of the device, at least a first and a second photomasks must be separately aligned with the wafer during two separate exposures to form the desired pattern on the wafer. If the first and second photomasks are not aligned correctly, patterning error can result. The greater the misalignment potential, the greater the patterning error that can result.

It has been found that where the same edge is patterned by two separate photomasks, the patterning errors due to misalignment can be problematic and may, in some instances, be detrimental to circuit function. This can be partly due to a low tolerance for patterning error that exists in some double patterning situations. For example, in some instances, both masks in a multi-patterning process may potentially be used to define a device feature having a critical dimension, such as a gate length in an integrated circuit. In some instances, the critical dimensions of such gates can be on the order of tens of nanometers (e.g., 45 nm or less). If the potential for misalignment of the photomasks used to define the gate is also on the order of tens of nanometers, an edge defined by a first photomask can be significantly and undesirably altered if the second photomask is also used to define that same edge. Thus, it has been discovered that such doubly defined edges are to be avoided in at least some situations where circuit function may be affected.

In order to avoid doubly defining edges, a single mask may be chosen for patterning an edge of the drawn pattern, as indicated at 106 of flow chart 100. Any suitable photomask may be chosen. If one photomask is deemed to be more effective for patterning a particular edge, that photomask may be chosen. For example, in 2p/2e processes, a first photomask may be preferred for patterning edges that define critical dimensions, such as gate lengths, or other edges that run in the same direction as the edges defining the gate lengths. A second photomask may be preferred for patterning edges that do not run in the same direction as the edges that define the gate lengths. The first and second photomasks can be any suitable type of masks. In an embodiment, the first photomask can be an alternating phase shift mask for defining fine features of a drawn circuit design and the second mask can be a trim mask for defining coarse features of the drawn circuit design. The trim mask can generally be any suitable type of mask, and will often be used to pattern less critical edges than the first mask. For example, the trim mask can be a binary mask or an embedded attenuated phase mask. In another embodiment, both the first and second masks can be embedded attenuated phase masks.

Referring again to the embodiment of FIG. 1, photomask patterns capable of patterning the edge at 106 of flow chart 100 are formed for the first photomask that is chosen to pattern the edge. As shown at 108 of flowchart 100, a second photomask pattern for the photomask that is not chosen to pattern the edge is formed to have wings adjacent to that edge for protecting the edge from double patterning. Forming these wings generally involves forming the second photoresist pattern to have shorter dimensions than it might otherwise have if the edge was to be defined using the second photomask pattern. The formation of these wings will be discussed in greater detail below.

After the first and second photomask patterns are generated, additional processing of the patterns is carried out to, for example, correct the mask patterns for proximity effects and prepare the patterns to send to the mask manufacturer. The mask manufacturer then writes the first and second photomasks, which can be used to manufacture integrated circuit devices.

The processes of the present application are not limited to alternating phase shift technologies using phase and trim masks, but may also be employed for making any type of photomask for use in any multi-pattern process. For example, the processes of the present disclosure may be used as part of a multi-pattern process implemented using binary masks, embedded attenuated phase shift masks, hard phase shift masks, double-dipole exposure masks, or any other type of mask that can be used in a multi-pattern process. For illustration of the principles of this disclosure only, we refer to an embodiment that employs a pair of masks comprising an alternating phase mask and a trim mask (which trim mask can be, for example, an embedded attenuated mask or a binary mask). However, this illustrated embodiment should not be taken as limiting the scope of the disclosure in any way. For example, as discussed above, another embodiment of the present disclosure can include employing two embedded attenuated phase masks instead of the alternating phase mask and trim mask. In yet another embodiment, two binary masks can be employed in place of the alternating phase mask and trim mask. One of ordinary skill in the art would readily understand how the principles of this disclosure can be applied using these other types of masks.

FIG. 2 illustrates a drawn pattern 200 for a broken-H gate, which may also be known as a cross-over gate or twist-gate. The drawn pattern 200 includes polygon shaped pattern segments 210, 212, 214, 216 and 218, for patterning the broken-H gate. Pattern segments 210 and 218 are gates. Pattern segment 214 includes two gate patterns 214a and 214c, at least portions of which gate patterns are formed over active regions (not shown). Gate patterns 214a and 214c are electrically coupled together by an interconnect 214b, which is formed over a field region of the substrate. Such broken-H gates are well known in integrated circuit fabrication.

FIG. 3 illustrates an embodiment of a phase pattern for forming the drawn pattern of FIG. 2. Phase blocks 310, 312, 314 and 316 are placed so as to define the vertical edges of the broken-H gate structure. As described above, techniques for positioning phase patterns are generally well known in the art.

In an embodiment of the present application, phase blocks 312 and 314 can be positioned a distance, $d_1$, from horizontal edges 318 of drawn pattern segment 214. This results in wings 320 being formed between the phase blocks 312 and 314 and edges 318 of drawn segment 214. Because edges 318 can be defined by both phase blocks 312 and 314, as well as the trim mask pattern segments 410, shown in an embodiment of FIG. 4, the wings 320 protect these edges from double patterning. As described above, such double patterning can potentially cause problems due to misalignment between the first and second photomasks.

The positioning of phase blocks 312 and 314 to form wings 320 can occur any suitable time during mask making. In one embodiment, wings 320 can be formed during generation of the initial photomask patterns, such as, for example, by the photomask pattern generation software 120 of FIG. 7, below. In another embodiment, the proximity correction software 160 of FIG. 7 can be programmed to recognize the risk of double patterning and form wings 320. In an embodiment, the edges that are potentially doubly defined can be marked during the photomask pattern generation, and the proximity correction software can be programmed to identify the marked edges and respond by forming the wings.

In another embodiment, it may be determined that the potential for misalignment of the phase and trim patterns does not pose a significant risk to the edges 318. For example, in some cases it may be determined that there is sufficient tolerance for error when patterning drawn pattern segment 214b that the potential of misalignment that can occur if edges 318 are doubled patterned does not pose a significant detrimental risk to circuit function. In this case, phase patterns 312 and 314 can be formed without wings 320, so as to abut edge 318.

Figure 4:
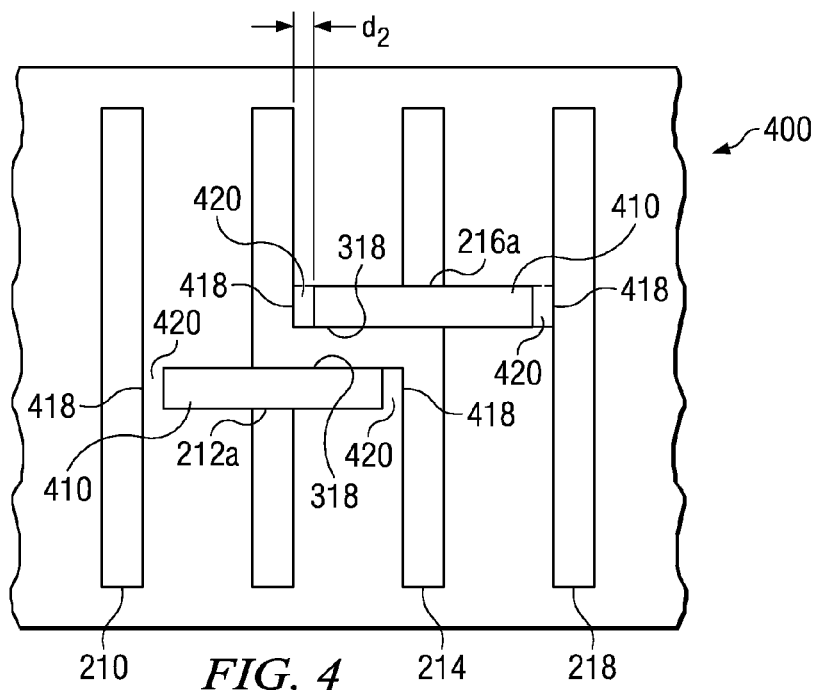
FIG. 4 illustrates an embodiment of a second photomask pattern for forming the drawn pattern of FIG. 2, according to an embodiment of the present application.

FIG. 4 illustrates a trim mask 400 that can be used in conjunction with the phase mask of FIG. 3 in an alternating phase shift processes ("altPSM") for implementing the drawn pattern of FIG. 2, according to an embodiment of the present application. Trim mask 400 includes trim patterns 410 for defining edges 212a and 216a of the drawn pattern, as well as a portion of edges 318. In an embodiment of the present application, trim patterns 410 can be positioned a distance, $d_2$, from vertical edges 418 of drawn pattern segments 210, 214 and 218. This results in wings 420 being formed between the trim patterns 410 and portions of the vertical edges of drawn segments 210, 214 and 218, as illustrated. Wings 420 can protect edges 418 from double patterning.

The problems associated with double patterning can be especially problematic for the vertical edges 418 of the gate structures, as some or all of these edges may define critical dimensions of the gates. In some embodiments, the critical dimensions can be very small, such as, for example, about 45 nm or less. Thus, even a small amount of misalignment error, such as 20 nm, or even less, can potentially have a large detrimental effect on the functionality of the circuit. The term "critical dimension" ("CD") is defined herein as the width of a patterned line that must be within design tolerances in order to maintain device performance consistency. For example, in one embodiment the CD is gate length.

The distances, $d_1$ and $d_2$, that define the width of wings 320 and 420 in the above embodiments may be chosen to be any suitable distance that will provide a desired degree of protection from double patterning. The distances chosen may vary depending on the misalignment tolerances for the lithography system being employed, the acceptable tolerances for patterning error of a particular pattern segment, and any potential detrimental effects of increasing the size of the wings. Thus, for example, $d_1$ may be chosen to be smaller than $d_2$ if it is determined that there is more tolerance for patterning errors when patterning edges 318, as opposed to patterning edges 418. In some embodiments, however, it may be advantageous to form $d_2$ to be as small as possible while still providing a desired degree of misalignment protection to the gate structures, due to possible detrimental effects of forming larger wings. This is because the smaller the dimensions of patterns 410, the more difficult it is to control the imaged patterns resulting in the photoresist from patterns 410 due to lithographic limitations. Where such patterns are too small, they may fail to form a pattern in the photoresist altogether. Thus, because increasing $d_2$ effectively decreases the size of the patterns 410, it can make the patterns 410 more difficult to implement in the photoresist. For this reason, it may be desirable to form wings 420 so that $d_2$ is relatively small, while still providing the desired protection against misalignment.

In an embodiment, the wing has a width that is greater than the alignment tolerance between a wafer pattern formed by the first photomask and a wafer pattern formed by the second photomask. Exemplary ranges for $d_1$ can range from about 2 nm to about 100 nm, such as about 5 nm to about 35 nm, or about 10 nm to about 25 nm. Exemplary ranges for $d_2$ can range from about 2 nm to about 100 nm, such as about 5 nm to about 35 nm, or about 10 nm to about 25 nm. As stated, these ranges are exemplary only, and values for $d_1$ and $d_2$ outside of these ranges are also contemplated, depending on, for example, the misalignment tolerances of the lithography system, as well as other factors, such as those described above.

The dimensions disclosed for $d_1$ and $d_2$, as well as all dimensions disclosed herein unless otherwise expressly stated, are based upon the size of the pattern to be formed on the wafer. The actual dimensions for $d_1$ and $d_2$ for the photomask patterns will vary depending upon the size of the reduction factor of the photomask. As discussed above, photomasks are often formed to have, for example, a 4× or 5× reduction factor, meaning that the photomask pattern dimensions can be about 4 or 5 times larger then the corresponding dimensions formed on the wafer. Similarly, the dimensions of the drawn pattern may or may not also have a reduction factor. Therefore, as one of ordinary skill in the art would readily understand, the mask sizes and the drawn pattern sizes can correspond to the wafer dimensions based on any suitable reduction factor, including where the dimensions on the mask and/or drawn pattern dimensions are intended to be the same as those formed on the wafer.

An embodiment of FIGS. 3 and 4 show both the phase mask pattern 3 and the trim mask pattern 4 having wings. However, in other embodiments, only one of the masks may include wings. For example, in an embodiment, as discussed above, the phase mask pattern 3 does not include wings and the trim mask 4 does include wings. In another embodiment, the phase mask pattern 3 does include wings and the trim mask 4 does not. In addition, the embodiment of FIGS. 3 and 4 include wings that are positioned so as to overlap a same region of the wafer, so as to result in an added pattern 614d, as illustrated in FIG. 6B, which will be discussed in greater detail below. However, in other embodiments, a wing of the first photomask does not overlap a region of the substrate over which a wing of mask 400 is positioned, and vice versa. For example, a wing of the first photomask can be positioned proximate an edge of a pattern that is to be formed on a region of the substrate outside of the pattern region shown in FIG. 4.

Similarly as described above, after the phase and trim patterns of the embodiments of FIGS. 3 and 4 are generated, additional processing of the patterns is carried out to, for example, correct the photomask patterns for proximity effects and prepare them to send to the mask manufacturer. The mask manufacturer then employs the resulting photomask patterns to write the first and second photomasks, which can be used to manufacture integrated circuit devices.

Figure 5:
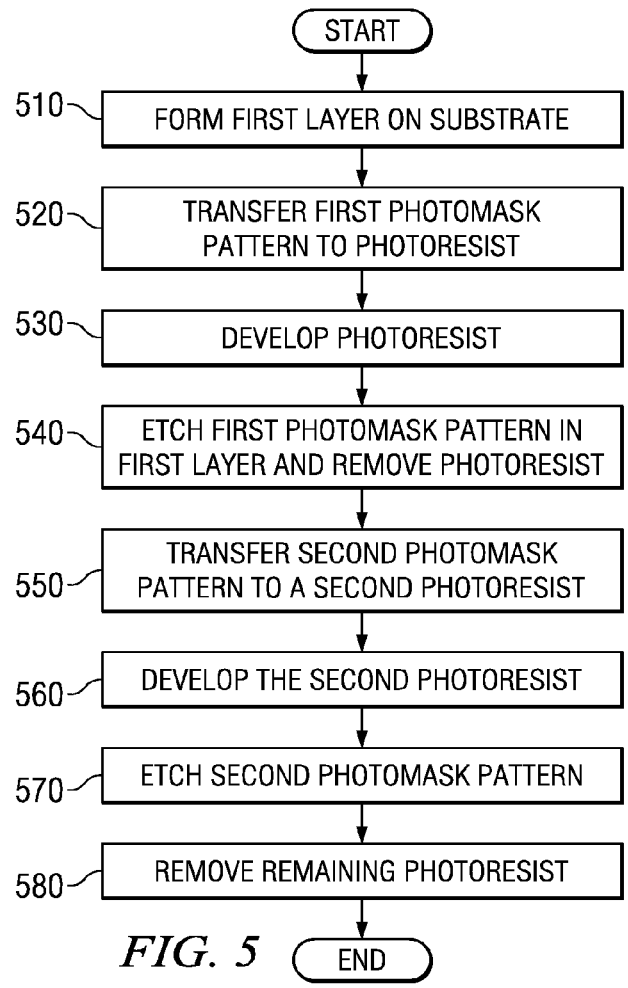
FIG. 5 illustrates an exemplary method for forming a semiconductor device using photomasks, according to an embodiment of the present application.

An exemplary method 500 for forming an integrated circuit device using the photomasks of the present application is shown in FIG. 5. At 510, a first layer, including one or more of a hardmask and a device layer, can be formed on a substrate. The device layer can include any desired material suitable for making the desired device, including conductive materials, such as metals and doped polysilicon; and semiconducting and insulating materials, such as undoped polysilicon, oxides, and nitrides. In an embodiment, the device layer includes at least one material chosen from metals and polysilicon.

A photoresist layer can be formed on the first layer. At 520, a beam of radiation can be used to transfer the pattern of a first photomask that includes target pattern features to the photoresist. For example, a phase shift mask including phase pattern 300, shown in FIG. 3, can be used to transfer a first photomask pattern to the photoresist.

At 530 of FIG. 5, the photoresist with the imaged pattern of the first photomask can be developed. This process forms a photoresist pattern (not shown). The photoresist pattern can then be transferred at 540 into the first layer by a first etch. The photoresist can then be removed.

Figure 6A:
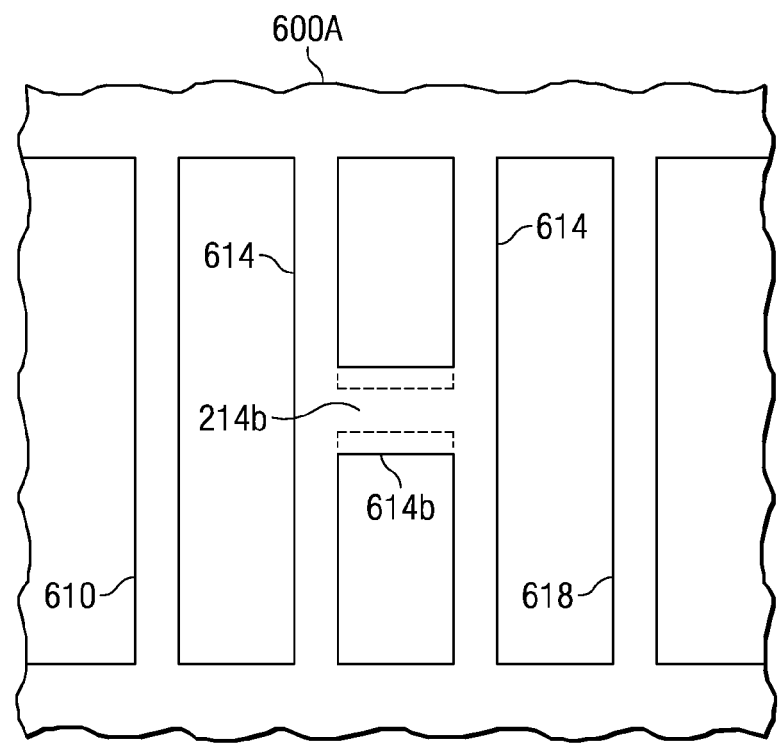
FIG. 6A illustrates a pattern formed on a substrate using the photomask patterns illustrated in FIG. 3, according to an embodiment of the present application.
Figure 6B:
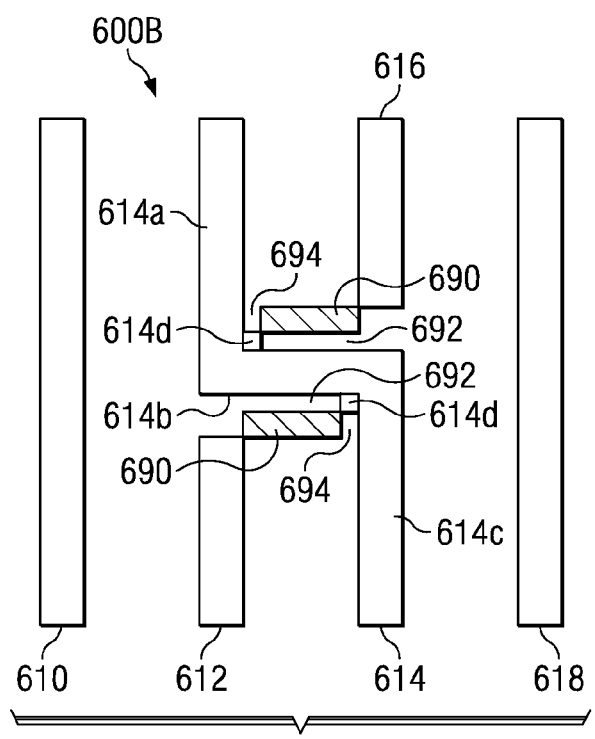
FIG. 6B illustrates a pattern formed on a substrate using both of the photomask patterns illustrated in FIGS. 3 and 4, according to an embodiment of the present application.

FIG. 6A illustrates an example of a resulting wafer pattern 600A formed in the first layer after the etch 540 of FIG. 5, where a phase pattern 300 of FIG. 3 was transferred into the first layer. As shown in FIG. 6A, the wafer pattern 600A includes vertical edges that are substantially similar to the vertical edges of the drawn pattern. The vertical edges 610 and 618 correspond to the vertical edges 210 and 218 of the drawn pattern 200. In an embodiment, pattern 614 includes substantially all of the vertical edges of segments 212, 214 and 216 of drawn pattern 200, with the exception of portions of the vertical edges of the drawn pattern 200 adjacent to segment 214b, which are not formed due to the positioning of wings 320. Wings 320 in phase mask pattern 300 of FIG. 3 have resulted in an increased width for wafer pattern segment 614b, when compared to the drawn pattern segment 214b dimensions, as indicated by the dashed lines in FIG. 6A.

After forming wafer pattern 600A, a second photoresist layer is deposited over wafer pattern 600A. Referring again to FIG. 5, a second exposure process can then be used to transfer the pattern of a second photomask to the second photoresist at 550. For example, the pattern of trim mask 400, as shown in FIG. 4, can be transferred to the photoresist at 550 and the photoresist pattern developed, as at 560. The trim mask 400 can be aligned with the pattern of FIG. 6A during the second exposure so that the image will result in removal of the desired portions of wafer pattern 600A during the subsequent etch process at 570 of FIG. 5. The remaining photoresist can then be removed at 580 of FIG. 5.

FIG. 6B illustrates an example of a resulting wafer pattern 600B formed in an integrated circuit as a result of the manufacturing process of FIG. 5. Wafer pattern 600B is substantially similar to drawn pattern 200, but may include unetched pattern additions, such as 614d, which are formed as a result of wings 320 and 420 of phase pattern 300 and mask pattern 400, respectively. In some embodiments, pattern additions 614d can be formed over field regions of the wafer, and other than a small increase in capacitance, are not likely to substantially affect the performance of the circuit. In other embodiments, such as where the phase mask of FIG. 4 does not include wings 320, pattern additions 614d may not exist because the portion of the first layer corresponding to pattern additions 614d can be etched away, for example, during the etch at 540 of the embodiment of FIG. 5.

In an embodiment, regions of the etched substrate that correspond to the wings may be etched to a first depth; while regions of the etched substrate that correspond to double patterned regions may be etched to a second depth that is greater than the first depth. In many instances this can be acceptable, such as, for example, where the double etching occurs over field regions of the device or other non-critical regions, or where the double etching results in a relatively small amount of additional etching that does not significantly and detrimentally effect the desired performance of the device. For example, in an embodiment shown by FIG. 6b, these double patterned regions are shown as the hatched regions 690. Double patterned regions 690 will be etched twice, once during the etch at 540 and again during the etch at 570; while the surrounding regions of the substrate are etched once, either during the trim mask etch at 570, as in the case of region 692, or during the phase mask etch 570, as in region 694 that corresponds to the area of the wing pattern that was etched during the phase mask etch. This can result in the double patterned portions 690 of the substrate being etched deeper then the adjacent regions that are not double patterned, such as the regions 694 corresponding to wings 420. The difference in depth may vary depending on such things as the etch process parameters and the type of substrate material. For example, the difference in depth can range from about 0.1 nm to about 25 nm. These relative etch depths are for example purposes only, and differences in depths outside of these ranges can also be realized. In an alternative embodiment, the double patterned regions 690 are not etched to a greater depth, but have the same etch depth as the wing regions 694.

The wafer pattern 600B may also include pattern differences relative to drawn pattern 200 that can occur due to imperfections in the patterning process. As one of ordinary skill in the art would readily recognize, such imperfections may result in, for example, rounded corners, where the drawn pattern corners are square.

Referring again to FIG. 5, in some embodiments where the first layer at 510 comprises both a hardmask and a device layer, the gate features and other circuit structure features can be transferred first to the hardmask by exposing two separate photoresists using a first photomask pattern and a second photomask pattern, as described above. The hardmask pattern is then transferred to the device layer during as subsequent etch process. Exemplary hardmask materials can include silicon oxynitride, silicon nitride, and silicon oxide. Alternatively, when a hardmask is not employed, so that, for example, the photoresist is formed directly on the device layer, the gate features and the circuit structure features in the photoresist can be transferred directly to the device layer during the etches at 540 and 570.

FIG. 7 illustrates a system 700 for forming a photomask pattern, according to an embodiment of the present disclosure. System 700 includes a first computer 710 and a second computer 750. Input devices 712,752 and output devices 714, 754 are respectively coupled to computers 710 and 750, which are in turn respectively coupled to databases 716, 756, as shown in FIG. 7. Input devices 712, 752 may comprise, for example, a keyboard, a mouse, and/or any other device suitable for inputting and manipulating data to the respective computers 710 and 750. Output devices 714,754 may comprise, for example, a display, a printer, and/or any other device suitable for presenting data from the respective computers 710 and 750.

Computers 710 and 750 can be personal computers, workstations, networked computers, or any other suitable processing platform. Computers 710 and 750 may include processors 718,758, as shown in FIG. 7. The processor 718, 758 can be implemented using at least one microprocessor from vendors such as Intel, Advanced Micro Devices, Transmeta, IBM, or other circuit manufacturers. In addition, computer 710 can include photomask pattern generation software 720. Computer 750 can include proximity correction software 760.

Photomask pattern generation software 720 and proximity correction software 760 can exist as computer readable instructions in source code, object code, executable code or other formats; program instructions implemented in firmware; or hardware description language (HDL) files. Any of the above can be embodied on a computer readable medium, which include storage devices and signals, in compressed or uncompressed form. Exemplary computer readable storage devices include conventional computer system RAM (random access memory), ROM (read-only memory), EPROM (erasable, programmable ROM), EEPROM (electrically erasable, programmable ROM), and magnetic or optical disks or tapes.

Processor 718 can be configured to control the flow of data between input device 712, output device 714, database 716, and photomask pattern generation software 720. Photomask pattern generation software 720 may receive descriptions of integrated circuit device features and generate photomask patterns. After the photomask data is generated, processor 718 can transfer the mask pattern database to computer 750 for further processing. The computers 710, 750 can be coupled together over a network (not shown). The network can be a local area network, a wide area network or a combination thereof. The communication protocol between the computers 710,750 can be implemented with IEEE802.x, token ring, or other similar network protocol.

Processor 758 of computer 750 can be configured to control the flow of data between input device 752, output device 754, database 756, and proximity correction software 760. Proximity correction software 760 can be configured to process the photomask pattern data received from computer 750. Specifically, proximity correction software 760 performs a proximity correction process that corrects the mask pattern data for proximity effects.

Databases 716, 756 may comprise any suitable system for storing data. Databases 716, 756 can be implemented using database technologies from Oracle, Sybase, MySQL or other similar database vendors. Database 716 can store records 724 (data or files) that comprise data associated with the integrated circuit device features and the photomask patterns to be generated, such as data from a design database and mask pattern database, as will be described in greater detail below. Database 756 may store records 764 (data or files) that comprise data associated with the proximity correction process, such as, for example, the photomask pattern database transferred from computer 710.

As discussed above, the processes of the present disclosure, including the process of FIG. 1 above, can be implemented using the photomask pattern generation software 720 and/or the proximity correction software 760. Further, different parts of the process can be carried out by the same or different computers. For example, steps 102 and 104 of FIG. 1 can be performed by photomask pattern generation software 720 and steps 106 and 108 can be performed by proximity correction software 760. One of ordinary skill in the art would readily be able to write software for performing the processes of the present application.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. Thus, for example, reference to "an acid" includes two or more different acids. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. A method for preparing a photomask set for a lithography process that employs a plurality of photomask patterns to pattern a layer on a substrate in the fabrication of an integrated circuit, the method comprising:
    loading data describing an integrated circuit level of a drawn circuit design into a computer;
    using the computer with the loaded data, generating a first mask pattern for defining fine features of the integrated circuit level including phase blocks for defining edges setting critical dimensions of device structures of the drawn circuit design;
    using the computer, generating a second mask pattern for defining coarse features of the integrated circuit level including pattern segments for masking at least portions of the fine features of the first mask pattern including at least portions of the device structures defined by the first mask pattern;
    using the computer, identifying edges of the second mask pattern that may potentially doubly define the critical dimension setting edges of the at least portions of the device structures in composite aligned exposures of the first and second mask patterns onto a layer of a substrate for forming the integrated circuit level;
    using the computer, modifying the second mask pattern the trim mask based on the identified critical dimension setting edges, to prevent such potentially doubly defined critical dimension setting edges; and
    preparing a first photomask using the first pattern and a second photomask using the modified second pattern.

2. The method of claim 1, wherein modifying the second mask pattern includes modifying the second mask pattern to add one or more wings to a fine feature masking pattern for masking the critical dimension setting edges defined by the first mask pattern from double patterning by the second mask pattern.

3. The method of claim 1, wherein the first pattern is an alternating phase shifting pattern and the second mask pattern is a trim pattern.

4. The method of claim 3, wherein the critical dimension setting edges are vertical edges defining gate lengths of gate structures.

5. The method of claim 2, wherein the one or more wings have are from about 2 nm to about 100 nm wide.

6. The method of claim 2, wherein the one or more wings have widths that are greater than an alignment tolerance between a layer pattern formed by the first photomask and a layer pattern formed by the second photomask.

7. The method of claim 1, wherein the second mask pattern is modified prior to adding proximity correction.

8. The method of claim 1, wherein the second mask pattern is modified during a proximity correction process.

9. A computer system for generating photomask patterns for a lithography process that employs a plurality of mask patterns to pattern a layer on a substrate in the fabrication of an integrated circuit, the system comprising one or more computers comprising a set of computer readable instructions executable for carrying out the following steps:
    based on data loaded into the computer describing an integrated circuit level of a drawn circuit design, generating a first mask pattern for defining fine features of the integrated circuit level including phase blocks for defining edges setting critical dimensions of device structures of the drawn circuit design;
    based on the data, generating a second mask pattern for defining coarse features of the integrated circuit level including pattern segments for masking at least portions of the fine features of the first mask pattern including at least portions of the device structures defined by the first mask pattern;
    identifying edges of the second mask pattern that may potentially doubly define the critical dimension setting edges of the at least portions of the device structures in composite aligned exposures of the first and second mask patterns onto a layer of a substrate for forming the integrated circuit level; and
    modifying the second mask pattern the trim mask based on the identified critical dimension setting edges, to prevent such potentially doubly defined critical dimension setting edges.

10. A process for fabricating an integrated circuit device, the process comprising:
    providing a substrate;
    forming a layer on the substrate;
    applying a first photoresist over the layer;
    exposing the first photoresist to radiation through a first photomask and developing the first photoresist to form a first pattern;
    etching to transfer the first pattern into the layer,
    removing the first photoresist;
    applying a second photoresist over the layer;
    exposing the second photoresist to radiation through a second photomask and developing the second photoresist to form a second pattern;
    etching to transfer the second pattern into the layer; and
    removing the second photoresist;
    wherein one of the first and second photomasks comprises an alternating phase shift mask and the other of the first and second photomasks comprises a trim mask;
    wherein the alternating phase shift mask includes a first mask pattern for defining fine features of a level of an integrated circuit including phase blocks for defining vertical edges of gate structures of a drawn circuit design; and wherein the trim mask includes a second mask pattern for defining coarse features of the level of the integrated circuit including pattern segments for masking at least portions of the fine features of the first mask pattern including at least portions of the gate structures defined by the alternating phase shift mask; the trim mask including a fine feature masking pattern for masking the at least portions of the gate structures of the drawn circuit design that is modified from the drawn design to prevent coincidence of vertical edges of the fine feature masking pattern with vertical edges of the at least portions of the gate structures defined by the phase blocks; thereby preventing double patterning of a same vertical edge of the layer.

11. The method of claim 10, wherein the fine feature masking pattern is modified by the addition of one or more wings to pattern segments generated to mask the at least portions of the gate structures of the drawn circuit design.

12. The method of claim 11, wherein the fine feature masking pattern is modified by a computer which generated pattern segments to mask the at least portions of the gate structures of the drawn circuit design, identifies edges that are potentially doubly defined, and responds to such identification by forming the wings.

* * * * *